United States Patent [19]

Hanley

[11] Patent Number: 5,739,687
[45] Date of Patent: Apr. 14, 1998

[54] MAGNETIC FIELD GENERATING ASSEMBLY

[75] Inventor: Peter Hanley, Gloucestershire, United Kingdom

[73] Assignee: Oxford Instruments (UK) Limited, Oxon, Great Britain

[21] Appl. No.: 748,013

[22] Filed: Nov. 12, 1996

[30] Foreign Application Priority Data

Nov. 15, 1995 [GB] United Kingdom ............... 9523415

[51] Int. Cl.$^6$ ........................................ G01V 3/00
[52] U.S. Cl. ........................................ 324/303; 324/320
[58] Field of Search ................................ 324/303, 306, 324/307, 309, 318, 319, 320

[56] References Cited

U.S. PATENT DOCUMENTS

| | | | |
|---|---|---|---|
| 4,350,955 | 9/1982 | Jackson et al. | 324/303 |
| 4,717,876 | 1/1988 | Masi et al. | 324/303 |
| 4,728,892 | 3/1988 | Vinegar et al. | 324/303 |

FOREIGN PATENT DOCUMENTS

| | | |
|---|---|---|
| 0 687 919 A1 | 12/1995 | European Pat. Off. |
| 2 141 236 | 12/1984 | United Kingdom |
| WO 92/07279 | 4/1992 | WIPO |
| WO 94/18577 | 8/1994 | WIPO |

OTHER PUBLICATIONS

U.S. application No. 08/489,511, Hanley, filed Jun. 12, 1995.

*Primary Examiner*—Louis M. Arana
*Attorney, Agent, or Firm*—Staas & Halsey

[57] ABSTRACT

A magnetic field generating assembly for use in NMR apparatus comprises a pair of first magnets arranged coaxially with like poles facing each other and axially spaced apart. At least one second magnet is positioned between the first magnets and with its axis coaxial with the first magnets. The axial positions and strengths of the magnets are arranged such that a working region is defined radially spaced from the magnets and extending substantially parallel with the axis of the magnets. The magnetic field within the working region is suitable for obtaining NMR information from material in the working region and exhibits a radial gradient which is substantially uniform in the axial direction.

11 Claims, 4 Drawing Sheets

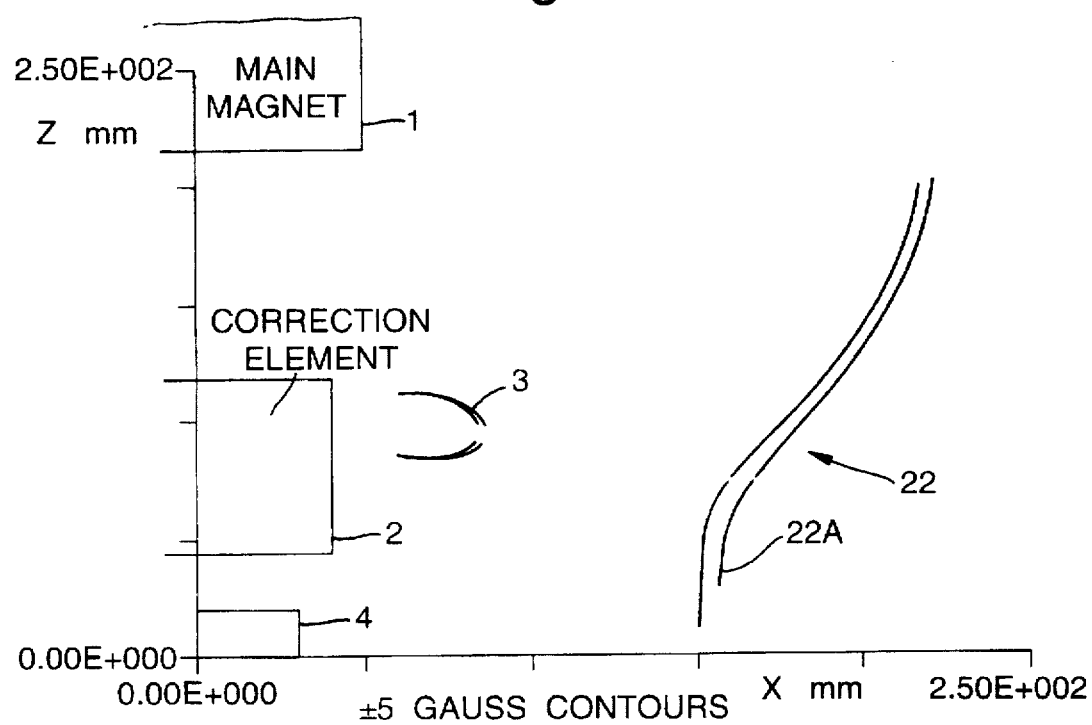
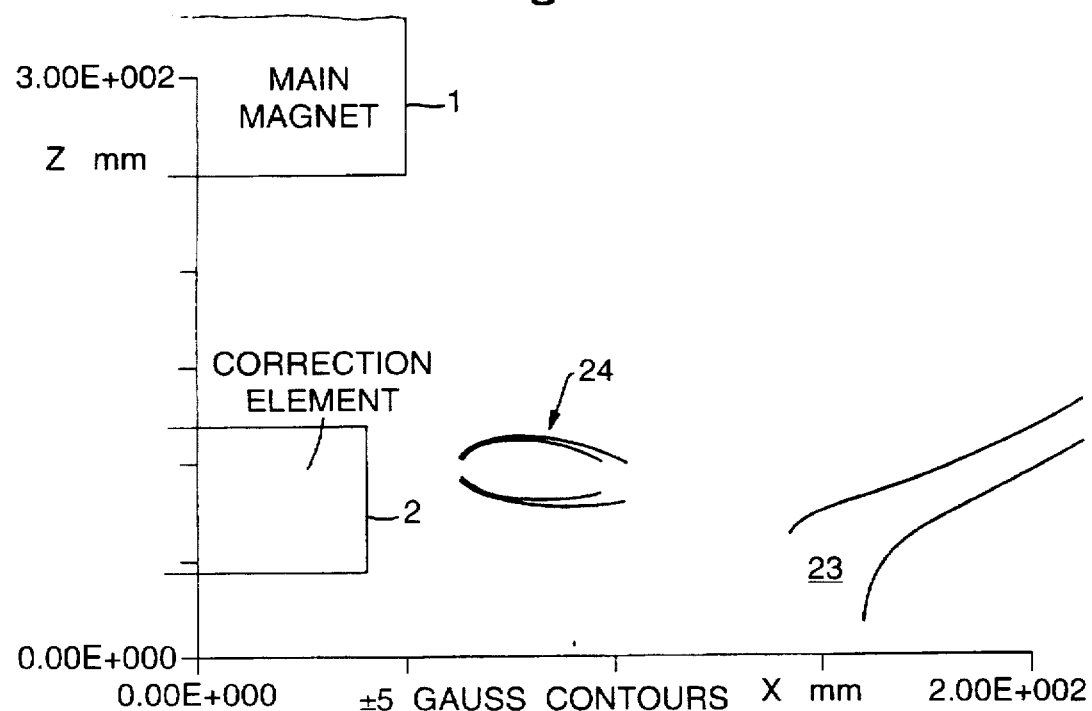

MAGNETIC FIELD GENERATING ASSEMBLY

FIELD OF THE INVENTION

The invention relates to a magnetic field generating assembly for generating a magnetic field within a working region, the field within the working region being suitable for obtaining NMR information from material in the working region.

DESCRIPTION OF THE PRIOR ART

Magnetic field generating assemblies for generating magnetic fields suitable for NMR are well known in a variety of fields but the present invention is particularly concerned, although not exclusively, with well logging applications. In these applications, the working region must be positioned outside the magnet assembly and in the surrounding rock in order to obtain NMR information from the rock. An early system of this type is described in U.S. Pat. No. 4,350,955.

In this arrangement, a pair of axially opposed magnets produce a radial field which has a maximum value and a region of uniformity over an annular volume whose radius is determined by the separation of the magnets. A variation on this scheme is described in WO-A-92/07279 whereby the radial extent of the homogeneous region is increased to improve the sensitivity of the NMR measurement.

In all these known systems, attention has been focused on achieving a high degree of radial uniformity in the magnetic field. Recently, it has been suggested that information can be gained about the types of fluid, for example brine or oil, in rock by obtaining the diffusion coefficient of the fluid. See for example "NMR Logging of Natural Gas Reservoirs", Akkurt et al, SPWLA 36th Annual Logging Symposium, Jun. 26–29, 1995. In order to determine a diffusion coefficient, it has been found that a strong radial gradient of the magnet field within the working volume is desirable. This is contrary to the current proposals for assemblies which attempt to maximise the radial uniformity of the field within the working volume.

SUMMARY OF THE INVENTION

In accordance with the present invention, a magnetic field generating assembly for use in NMR apparatus comprises a pair of first magnets arranged coaxially with like poles facing each other and axially spaced apart; and at least one second magnet positioned between the first magnets and with its axis coaxial with the first magnets, the axial positions and strengths of the magnets being arranged such that a working region is defined radially spaced from the magnets and extending substantially parallel with the axis of the magnets, the magnetic field within the working region being suitable for obtaining NMR information from material in the working region and exhibiting a radial gradient which is substantially uniform in the axial direction.

We have realised that it is possible to construct an assembly based upon the use of a pair of coaxially arranged first magnets and using at least one, and preferably two, second magnets to achieve a radial gradient which is substantially uniform in an axial direction within the working region. This is based on our realisation that the second order gradient of a magnetic field generated by a magnet when plotted as a function of its Z-position (i.e. axial position) changes sign which allows control to be achieved over the second order axial gradient from a pair of such magnets arranged coaxially.

Typically, the magnets will be permanent magnets since this is particularly suitable in well logging applications although in other applications solenoids (resistive or superconducting) or combinations of types of magnets could be used.

The degree of uniformity in the axial direction depends upon the requirements of the NMR apparatus with which the assembly is to be used but typically at least the first order axial gradient of the magnetic field within the working region is substantially zero.

The radial gradient also depends upon the needs of the particular application but in a typical application will be about 1 gauss per millimeter, the radial extent of the working region being about 10 mm. Typically, the axial length of the working region is at least 140 mm.

The working region itself is conveniently spaced at least 150 mm radially from the axis of the assembly. This ensures that the working region is located well within rock surrounding the assembly, in a well logging application.

Typically, the or each second magnet will be a solid, permanent magnet but in some cases, the or each second magnet is ring shaped. This has been found to improve their resistance to demagnetisation.

The invention also relates to NMR apparatus including a magnetic field generating assembly according to the present invention; and means for generating a RF magnetic field within the working region and having characteristics suitable for performing an NMR experiment on material within the working region; and means for sensing a RF magnetic field generated by nuclei from the material in the working region.

The means for generating and sensing the RF magnetic field can be of any conventional type.

In practice, the magnets of the magnet assembly will be axially adjustable in order to position them correctly so as to achieve the desired axial uniformity and radial gradient.

BRIEF DESCRIPTION OF THE DRAWINGS

Some examples of magnetic field generating assemblies for use in well logging applications will now be described with reference to the accompanying drawings, in which:

FIG. 5 is a contour plot similar to FIG. 3 but of a second example;

FIG. 6 is a contour plot similar to FIG. 3 but of a third example; and,

DETAILED DESCRIPTION OF THE EMBODIMENTS

The magnetic field generated by a permanent magnet can be expressed in terms of its radial and axial components, each of which can be defined in a Taylor series. Thus, the axial component B(z) of the magnetic field can be expressed in the form:

$$B(Z) = B(o) + Z\frac{\partial B}{\partial Z} + \frac{Z^2}{2!}\frac{\partial^2 B}{\partial Z^2} + \frac{Z^3}{3!}\frac{\partial^3 B}{\partial Z^3} + \frac{Z^4}{4!}\frac{\partial^4 B}{\partial Z^4} + \ldots$$

Figure 3:
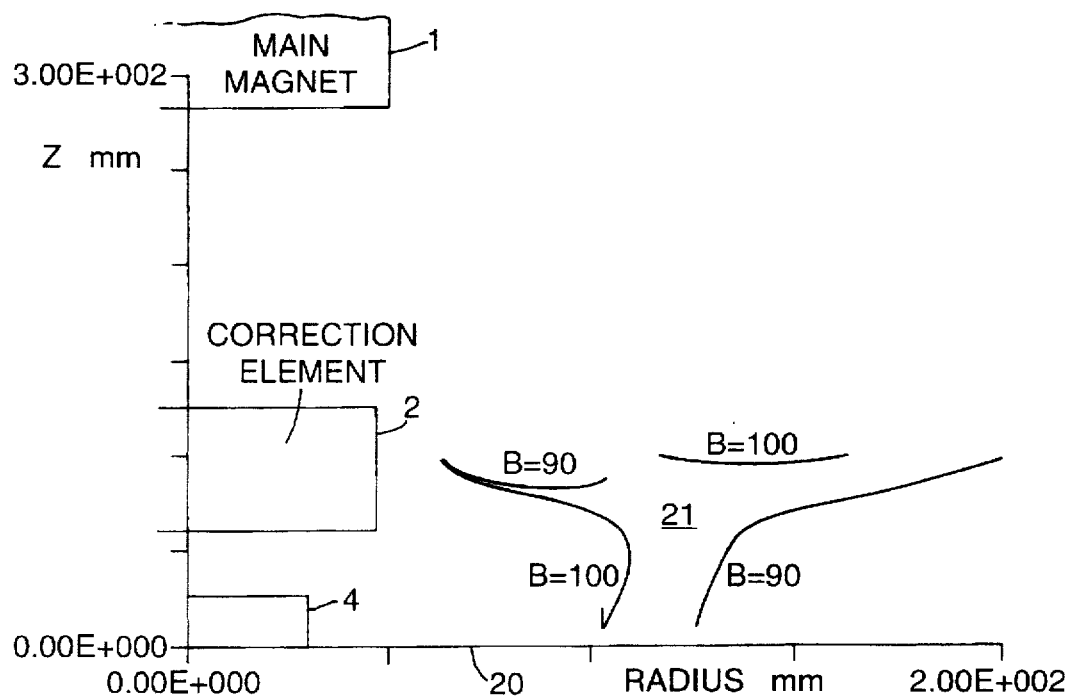
FIG. 3 is a magnetic field contour plot corresponding to FIG. 2 but also showing the location of the magnets.

If the field in the axial direction was completely uniform then all the terms on the right hand side of the equation would be 0 apart from the first.

direction out to a radius of +/−180 mm. The contour plot is shown in FIG. 3. There is a borehole lobe, but it is a long way away, and relatively small. If we allow a spectral width (i.e. radial field variation) of +/−5 gauss, the sensitive volume 21 (or working region) is 2.5 liters.

Other advantages would include a degree of spatial selection in the radial direction by changing the centre frequency, and the ability to perform diffusion-related measurements.

In order to show how different magnet assemblies would perform, some field calculations have been carried out.

The magnetic fields due to the magnetised elements were calculated by representing the elements as cylindrical current shells whose current density was M/4 pi per unit length. Note that this representation is exact in so far as the magnetisations are uniform.

Main Magnets Positioned At Z=+/−215 mm

Table 1 tabulates the field derivatives with respect to Z at X=150 mm of a pair of main magnets as described above. The variation is predominately second order.

TABLE 1

FIELD DERIVATIVES Gauss Millimetres Degrees
partial derivatives w.r.t. Z range 2.500E+001
at Z = 0.000E+000, X = 1.500E+002, Y = 0.000E+000

| Gauss order | Millimetres Bx | Degrees By | Bz | Bmod |
|---|---|---|---|---|
| 0 | 1.188E+002 | 0.000E+000 | −8.486E−006 | 1.188E+002 |
| 1 | 0.000E+000 | 0.000E+000 | 8.166E−001 | 0.000E+000 |
| 2 | 1.270E−002 | 0.000E+000 | 2.121E−008 | 1.831E−002 |
| 3 | 6.778E−010 | 0.000E+000 | −3.471E−005 | 4.167E−010 |
| 4 | 1.392E−006 | 0.000E+000 | −5.669E−009 | −4.032E−006 |
| 5 | −7.885E−011 | 0.000E+000 | −4.729E−008 | −3.213E−011 |
| 6 | 2.619E−008 | 0.000E+000 | 8.656E−010 | 4.651E−008 |
| dB6 | 1.387E−004 | 0.000E+000 | 4.586E−006 | |
| dBtotal− | 9.936E−001 | 0.000E+000 | −1.020E+001 | |
| dBtotal+ | 9.936E−001 | 0.000E+000 | 1.020E+001 | |

Figure 1:
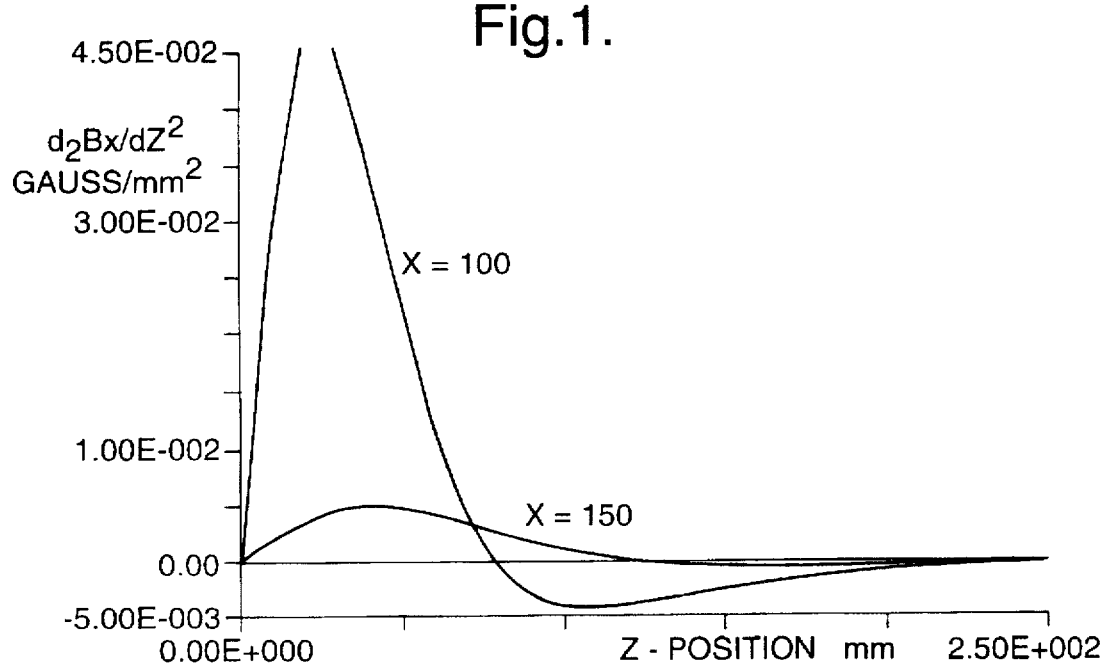
FIG. 1 is a plot of the second order $(d^2B_z/dz^2)$ gradient of a 40 mm diameter×30 long ferrite element as a function of its Z-position.

FIG. 1 is a plot of the second order $$\partial^2 B/\partial Z^2$$

gradient of a 40 mm diameter×30 mm long ferrite element as a function of its Z-position and at two different radii, X=100 mm and X=150 mm. It will be noted that the sign of this second order gradient changes and this enables us to control the second order axial gradient of a magnet assembly comprising a pair of coaxially aligned magnets with like poles facing one another and having at least one correction magnet also coaxially placed between the two magnets. Thus, by suitably adjusting the axial location of the magnets, control of the magnetic field within a working region spaced radially from the assembly can be achieved.

Figure 2:
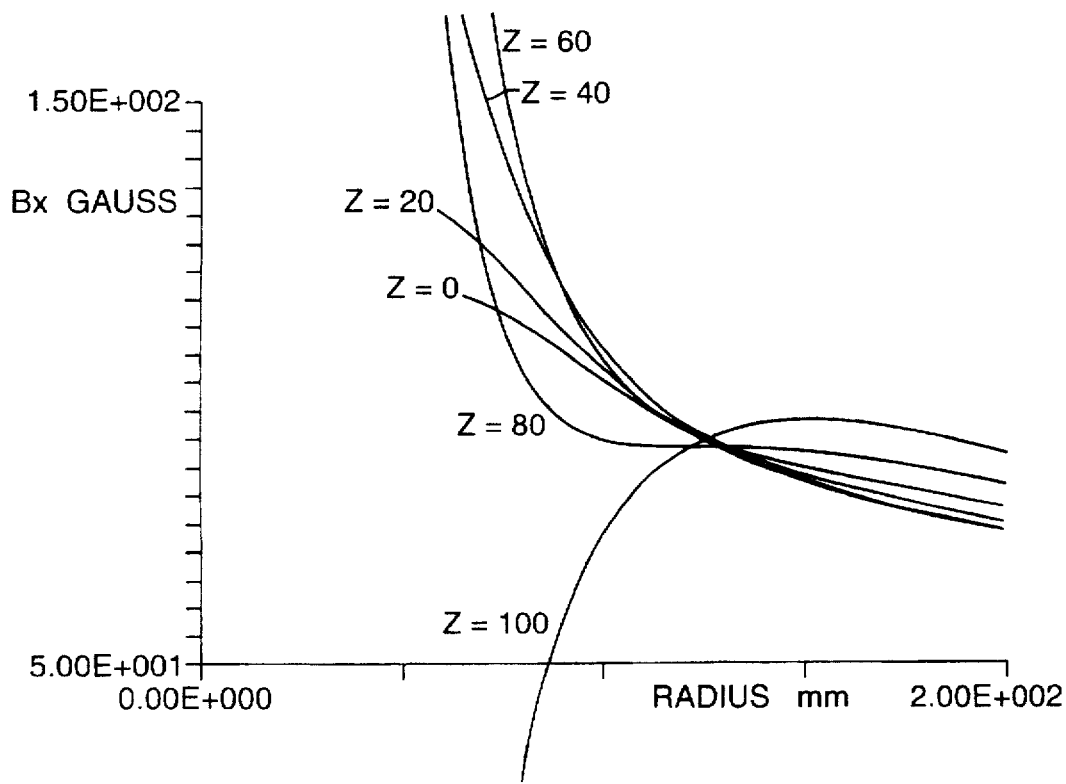
FIG. 2 is a plot of the radial field profiles produced by a first example of a magnetic field generating assembly according to the invention.

FIGS. 2 and 3 illustrate the radial field variation and field contours respectively of a first example comprising a pair of coaxially spaced first main magnets 1 and a pair of correction magnet elements 2 between the main magnets 1. In FIG. 3, one main magnet 1 and one correction magnet 2 are shown, the assembly being symmetrical about the central, radial plane 20. The magnets are omitted from FIG. 2.

Figure 4:
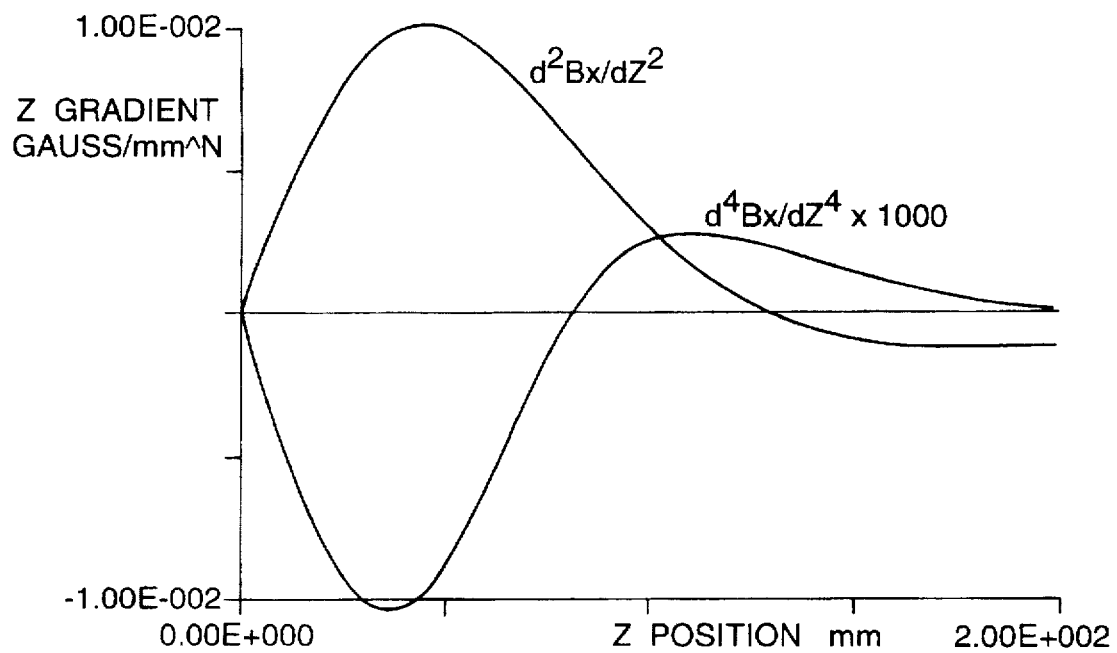
FIG. 4 is a plot of the second and fourth order field derivatives of a correction magnet as a function of its Z-position.

FIGS. 2 and 3 show that with such a system (two main magnets placed with their near poles respectively at Z=+/−280 mm plus a pair of correction magnets or elements centred respectively at Z=±88 mm), a set of radial field profiles is obtained which provide a significant, but not outrageous, radial gradient, but good uniformity in the Z If we now take a nominal correction element and plot its field derivatives as a function of its Z position, we get the curves shown in FIG. 4 for the second and fourth derivatives. We can choose a position where the ratio of second to fourth order derivatives is similar to that of the main magnets, and then scale the element to get the correct value of the second order derivative. Fortunately, the field of the correction element aids that of the main magnet and the total field is increased from 118.8 gauss to 169.3 gauss. Table 2 tabulates the derivatives for the complete system. We can see that the radial gradient is just under 1 gauss per mm, leading to a sensitive volume 10 mm thick (for a bandwidth of +/−5 gauss). The shape of the sensitive volume 22 in the Z-X plane is shown in FIG. 5. It can be seen that the cylindrical sensitive volume 22 has a straight portion 22A out to Z=±70 mm, and that the borehole lobes 3 are well separated from the sensitive volume 22.

It can be seen from FIG. 5 that the sensitive volume is about 1.5 liters which might be too small to achieve sufficient NMR response in some cases.

TABLE 2

Complete system with centre of correction elements at Z = ± 81.1. Diameter of elements 80 mm, full length 74 mm, M/4pi 270 A/mm.

FIELD DERIVATIVES Gauss Millimetres Degrees
partial derivatives w.r.t. Z range 2.500E+001
at Z = 0.000E+000, X = 1.500E+002, Y = 0.000E+000

| Gauss order | Millimetres Bx | Degrees By | Bz | Bmod |
|---|---|---|---|---|
| 0 | 1.693E+002 | 0.000E+000 | −1.589E−005 | 1.693E+002 |
| 1 | −1.099E−006 | 0.000E+000 | 1.830E−001 | −1.099E−006 |
| 2 | −1.553E−006 | 0.000E+000 | 3.111E−007 | 1.964E−004 |
| 3 | 4.219E−007 | 0.000E+000 | 1.276E−004 | 4.219E−007 |
| 4 | 2.278E−006 | 0.000E+000 | −6.802E−008 | 2.734E−006 |
| 5 | −4.860E−008 | 0.000E+000 | 1.346E−007 | −4.860E−008 |
| 6 | 1.750E−008 | 0.000E+000 | 8.337E−009 | 3.499E−008 |
| dB6 | 9.270E−005 | 0.000E+000 | 4.417E−005 | |
| dBtotal− | 2.289E−003 | 0.000E+000 | −2.329E+000 | |
| dBtotal+ | 2.289E−003 | 0.000E+000 | 2.329E+000 | |

Radial gradients

FIELD DERIVATIVES Gauss Millimetres Degrees
partial derivatives w.r.t. X range 2.500E+001
at Z = 0.000E+000, X = 1.500E+002, Y = 0.000E+000

| Gauss order | Millimetres Bx | Degrees By | Bz | Bmod |
|---|---|---|---|---|
| 0 | 1.693E+002 | 0.000E+000 | −1.589E−005 | 1.693E+002 |
| 1 | −9.456E−001 | 0.000E+000 | 1.382E−007 | −9.456E−001 |
| 2 | 1.383E−002 | 0.000E+000 | −2.543E−009 | 1.383E−002 |
| 3 | −4.040E−004 | 0.000E+000 | 7.055E−011 | −4.040E−004 |
| 4 | 1.131E−005 | 0.000E+000 | −1.440E−012 | 1.131E−005 |
| 5 | −2.306E−007 | 0.000E+000 | −2.901E−014 | −2.306E−007 |
| 6 | 1.163E−008 | 0.000E+000 | 8.701E−015 | 1.163E−008 |
| dB6 | 6.162E−005 | 0.000E+000 | 4.610E−011 | |
| dBtotal− | 1.304E+001 | 0.000E+000 | −1.950E−006 | |
| dBtotal+ | −1.086E+001 | 0.000E+000 | 1.550E−006 | |

Main Magnets Positioned At Z=+/−250 mm

Table 3 and FIG. 6 show a system similar to that of Table 2 and FIG. 5. The main magnets 1 are now spaced at +/−250 mm and a single pair of correction elements 2 is sized and positioned to cancel the second and much of the fourth order Z gradients. Each correction element has an axial dimension of 150 mm and are centred at Z=±80 mm respectively. The field has been reduced from 169 gauss to 121 gauss, but the sensitive volume 23 has been doubled by virtue of decreasing the radial gradient from about 1 to 0.56 gauss per mm. The axial length of the sensitive volume 23 has not been reduced, and the borehole lobe 24 is well separated.

TABLE 3

FIELD DERIVATIVES Gauss Millimetres Degrees
partial derivatives w.r.t. Z range 2.500E+001
at Z = 0.000E+000, X = 1.500E+002, Y = 0.000E+000

| Gauss order | Millimetres Bx | Degrees By | Bz | Bmod |
|---|---|---|---|---|
| 0 | 1.216E+002 | 0.000E+000 | −1.024E−005 | 1.216E+002 |
| 1 | −2.441E−007 | 0.000E+000 | 2.427E−001 | −2.442E−007 |
| 2 | −2.417E−004 | 0.000E+000 | 2.282E−007 | 2.425E−004 |
| 3 | 9.227E−008 | 0.000E+000 | 8.852E−005 | 9.230E−008 |
| 4 | −2.110E−008 | 0.000E+000 | −5.202E−008 | 6.708E−007 |
| 5 | −9.112E−009 | 0.000E+000 | 2.034E−007 | −9.113E−009 |
| 6 | −1.456E−009 | 0.000E+000 | 5.947E−009 | 4.373E−009 |
| dB6 | −7.717E−006 | 0.000E+000 | 3.151E−005 | |
| dBtotal− | −1.891E−002 | 0.000E+000 | −3.063E+000 | |
| dBtotal+ | −1.891E−002 | 0.000E+000 | 3.063E+000 | |

TABLE 3-continued

FIELD DERIVATIVES Gauss Millimetres Degrees
partial derivatives W.r.t. X range 2.500E+001
at Z 0.000E+000, X = 1.500E+002, Y = 0.000E+000

| Gauss order | Millimetres Bx | Degrees By | Bz | Bmod |
|---|---|---|---|---|
| 0 | 1.216E+002 | 0.000E+000 | −1.024E−005 | 1.216E+002 |
| 1 | −5.682E−001 | 0.000E+000 | 8.288E−008 | −5.682E−001 |
| 2 | 9.435E−003 | 0.000E+000 | −1.673E−009 | 9.435E−003 |
| 3 | −2.755E−004 | 0.000E+000 | 3.794E−011 | −2.755E−004 |
| 4 | 6.033E−006 | 0.000E+000 | 1.016E−013 | 6.033E−006 |
| 5 | −1.195E−008 | 0.000E+000 | −8.910E−014 | −1.195E−008 |
| 6 | −1.173E−008 | 0.000E+000 | 2.440E−015 | −1.173E−008 |
| dB6 | −6.217E−005 | 0.000E+000 | 1.293E−011 | |
| dBtotal− | 7.935E+000 | 0.000E+000 | −1.179E−006 | |
| dBtotal+ | −6.449E+000 | 0.000E+000 | 9.175E−007 | |

The correction elements 2 have been shown as solid, ferrite elements but could be replaced by ring shaped or annular elements in order to reduce the risk of demagnetisation.

In FIGS. 3 and 5 we have shown very schematically the RF transmitting and receiving coils at 4. In some cases, a single coil could be provided for both transmitting and receiving but it is preferred to use separate coils as described in WO-A-94/11748.

Figure 7:
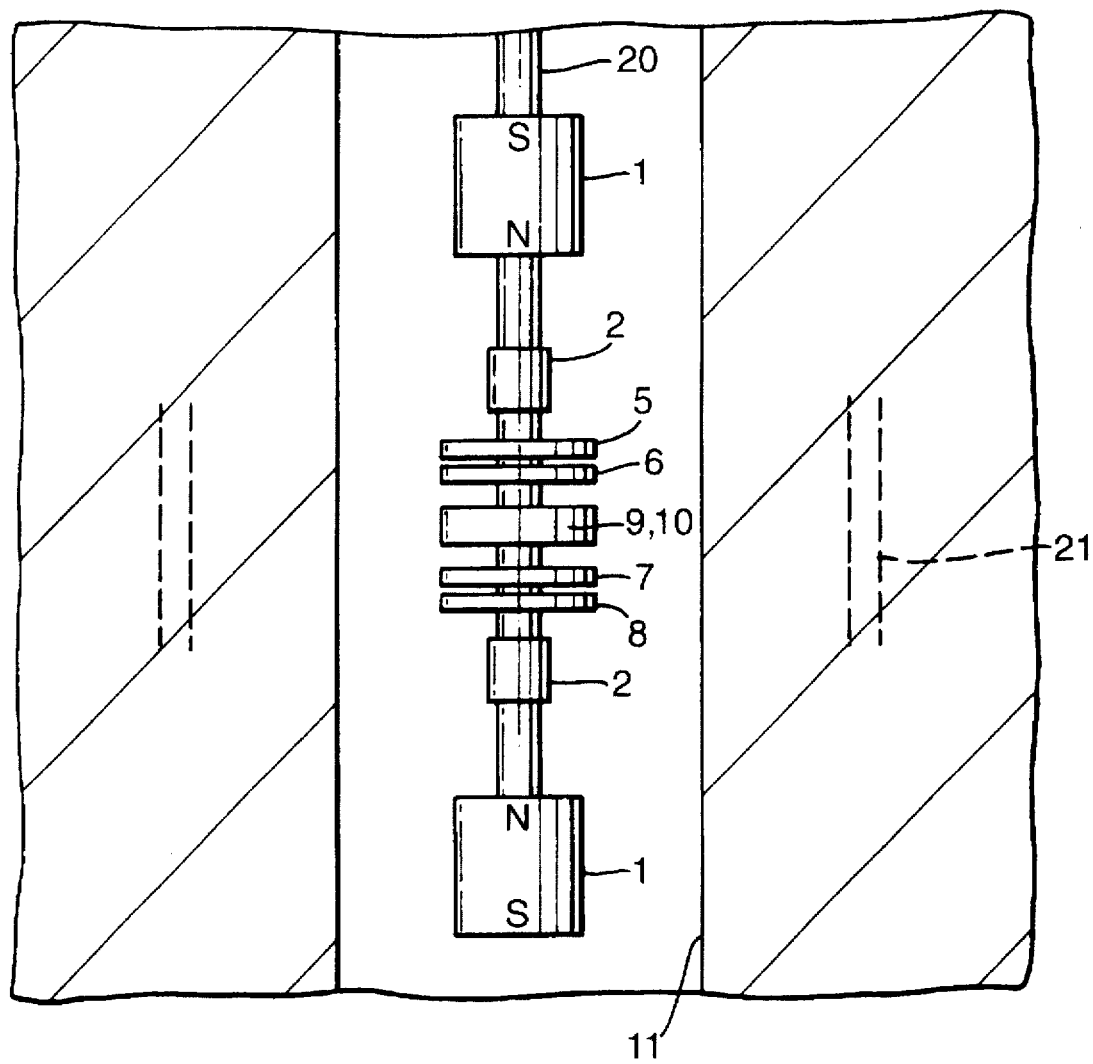
FIG. 7 is a diagram of the assembly inserted in a bore hole.

In a well-logging application, the magnets 1,2 will be mounted on a suitable support 20 (FIG. 7) and be axially adjustable relative to one another so as to enable the size and location of the working region 21 to be determined. The orientation of the magnets 2 will be determined as required in order to achieve the desired working region as will the strength of the magnets. As can be seen in FIG. 7, four RF transmitter coils 5–8 are positioned coaxially with the central axis of the support 20 in a space between the magnets 2 and a pair of receiver coils 9,10 are centrally positioned between the transmitter coils 6,7 coaxial with the central axis.

In use, the support 20 is coupled to a mechanism (not shown) which drops the assembly down through a bore hole 11. The working region 12 is formed in the rock around the bore hole 11 so that information can be obtained from that region.

I claim:

1. A magnetic field generating assembly for use in NMR apparatus, the assembly comprising:

a pair of first magnets arranged coaxially with like poles facing each other and axially spaced apart; and at least one second magnet positioned between said first magnets, the axis of the at least one second magnet being coaxial with said first magnets, so as to generate a magnetic field defining a working region, the working region being spaced from said first and second magnets and extending substantially parallel with the axis of said first and second magnets, wherein the axial positions and strengths of said first and second magnets are arranged such that at least the first order axial gradient of the magnet field within said working region is substantially zero, the radial dimension of said working region being less than the axial dimension, and the magnetic field within said working region being suitable for obtaining NMR information from material in the working region and exhibiting a radial gradient which is substantially uniform in the axial direction.

2. An assembly according to claim 1, wherein the radial gradient within said working region is about 1 gauss per millimeter.

3. An assembly according to claim 1, wherein said at least one second magnet is ring-shaped.

4. An assembly according to claim 1, wherein said working region is spaced at least 150 mm radially from the axis of the assembly.

5. An assembly according to claim 1, wherein the radial thickness of said working region is substantially 10 mm.

6. An assembly according to claim 1, wherein the axial length of said working region is at least 140 mm.

7. An assembly according to claim 1, wherein at least the first to third orders of the axial magnetic field are substantially zero.

8. An assembly according to claim 1, wherein said first and second magnets are permanent magnets.

9. An assembly according to claim 1, wherein said first and second magnets are axially adjustable.

10. A magnetic field generating assembly for an NMR apparatus, the assembly comprising:

a pair of first magnets arranged coaxially with like poles facing each other and axially spaced apart;

at least one second magnet positioned between said first magnets, the axis of the at least one second magnet being coaxial with said first magnets, so as to generate a magnetic field defining a working region, the working region being spaced from said first and second magnets and extending substantially parallel with the axis of said first and second magnets, wherein the axial positions and strengths of said first and second magnets are arranged such that at least the first order axial gradient of the magnet field within said working region is substantially zero, the radial dimension of said working region being less than the axial dimension, and the magnetic field within said working region being suitable for obtaining NMR information form material in the working region and exhibiting a radial gradient which is substantially uniform in the axial direction;

means for generating a RF magnetic field within said working region and having characteristics suitable for performing an NMR experiment on material within the working region; and means for sensing a RF magnetic field generated by nuclei from the material in the working region.

11. Apparatus according to claim 10, adapted for use ina bore hole.

* * * * *